(12) United States Patent
Harijono et al.

(10) Patent No.: US 10,395,751 B2
(45) Date of Patent: Aug. 27, 2019

(54) AUTOMATED TESTING SYSTEM AND OPERATING METHOD THEREOF

(71) Applicant: SK hynix Inc., Gyeonggi-do (KR)

(72) Inventors: Indra G. Harijono, San Jose, CA (US); Sungjoon Ahn, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 49 days.

(21) Appl. No.: 15/634,357

(22) Filed: Jun. 27, 2017

(65) Prior Publication Data

US 2017/0372800 A1    Dec. 28, 2017

Related U.S. Application Data

(60) Provisional application No. 62/355,738, filed on Jun. 28, 2016.

(51) Int. Cl.
| | |
|---|---|
| *G11C 29/00* | (2006.01) |
| *G11C 29/48* | (2006.01) |
| *G11C 29/10* | (2006.01) |
| *G11C 29/56* | (2006.01) |

(52) U.S. Cl.
CPC .............. *G11C 29/48* (2013.01); *G11C 29/10* (2013.01); *G11C 29/56004* (2013.01)

(58) Field of Classification Search
None
See application file for complete search history.

(56) References Cited

U.S. PATENT DOCUMENTS

| | | | |
|---|---|---|---|
| 6,898,784 B1 * | 5/2005 | Kossatchev | G06F 11/3684 714/E11.208 |
| 7,702,984 B1 | 4/2010 | Lee et al. | |
| 8,856,602 B2 | 10/2014 | Brown et al. | |
| 2004/0268181 A1 * | 12/2004 | Wang | G01R 31/318586 714/30 |
| 2008/0177922 A1 * | 7/2008 | Chow | G06F 11/2221 710/302 |
| 2017/0206034 A1 * | 7/2017 | Fetik | G06F 3/0653 |
| 2017/0220403 A1 * | 8/2017 | Maag | G06F 11/3692 |

* cited by examiner

*Primary Examiner* — Daniel F. McMahon
(74) *Attorney, Agent, or Firm* — IP & T Group LLP

(57) ABSTRACT

A system and an operating method thereof include a system under test (SUT) having a hardware array of flash storages, partitions including logical volumes, a kernel subsystem including an operating system, and an application layer including services, applications, and/or systems. The application layer receives test drivers and corresponding test fixtures from an external source. The SUT is segmented into subsystems of interest, and a different test using a different test fixture is applied to each subsystem. The tests are monitored and the results of the tests are collected and verified against suitable benchmarks. Results and associated data are archived.

20 Claims, 9 Drawing Sheets

AUTOMATED TESTING SYSTEM AND OPERATING METHOD THEREOF

CROSS-REFERENCES TO RELATED APPLICATIONS

This application claims the benefit of U.S. Provisional Application No. 62/355,738 entitled METHODS, APPARATUS AND INTELLIGENT SYSTEM FOR AUTOMATED, HARDENED AND ACCELERATED TESTING FOR SCALABLE FLASH ARRAY STORAGE SYSTEM filed Jun. 28, 2016, the entire contents of which are incorporated herein by reference.

BACKGROUND

Field of Invention

Exemplary embodiments of the present invention relate to an apparatus of a system, and more particularly to an automated testing system and an operating method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include flash memory components and a SSD controller. The SSD controller can be also referred as a processor, which includes the electronics that bridge the flash memory components to the SSD input/output (I/O) interfaces. The SSD controller can include an embedded processor that can execute functional components, such as firmware. The SSD functional components are device specific, and in most cases, can be updated.

The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NOR-type flash allows a single machine word (byte) to be written to an erased location or read independently. The NAND-type operates primarily in memory cards, USB flash drives, solid-state drives, and similar products, for general storage and transfer of data.

Thus, there remains a need for a system and operating method thereof for automated testing. In view of the ever-increasing need to improve performance and reliability, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a system and an operating method thereof capable of improving the performance and reliability of a memory system.

In accordance with an embodiment of the present invention, there is provided with a system. The system includes at least a system under test (SUT) having collection of flash storages including hardware of array of flash storages, collection of partitions including logical volumes, a kernel subsystem including operating system, and an application layer including services, applications, systems, or a combination thereof; test drivers configured to drive tests, wherein the tests are configured for testing the SUT, test fixtures configured to generate test data sets corresponding to the test drivers; observers configured to track test results of test cases created in accordance with the test drivers and the test data sets, wherein the test results include metrics, and archives configured to store historical data of the test cases.

In accordance with an embodiment of the present, there is provided with an operating method of a system. The method includes the septs of providing at least a system under test (SUT) having collection of flash storages including hardware of array of flash storages, collection of partitions including logical volumes, a kernel subsystem including operating system, and an application layer including services, applications, systems, or a combination thereof; driving tests by test drivers, wherein the tests are configured for testing the SUT, generating test data sets corresponding to the test drivers by test fixtures; tracking test results of test cases created in accordance with the test drivers and the test data sets by observers, wherein the test results include metrics, and storing historical data of the test cases in archives.

DETAILED DESCRIPTION

Figure 1:
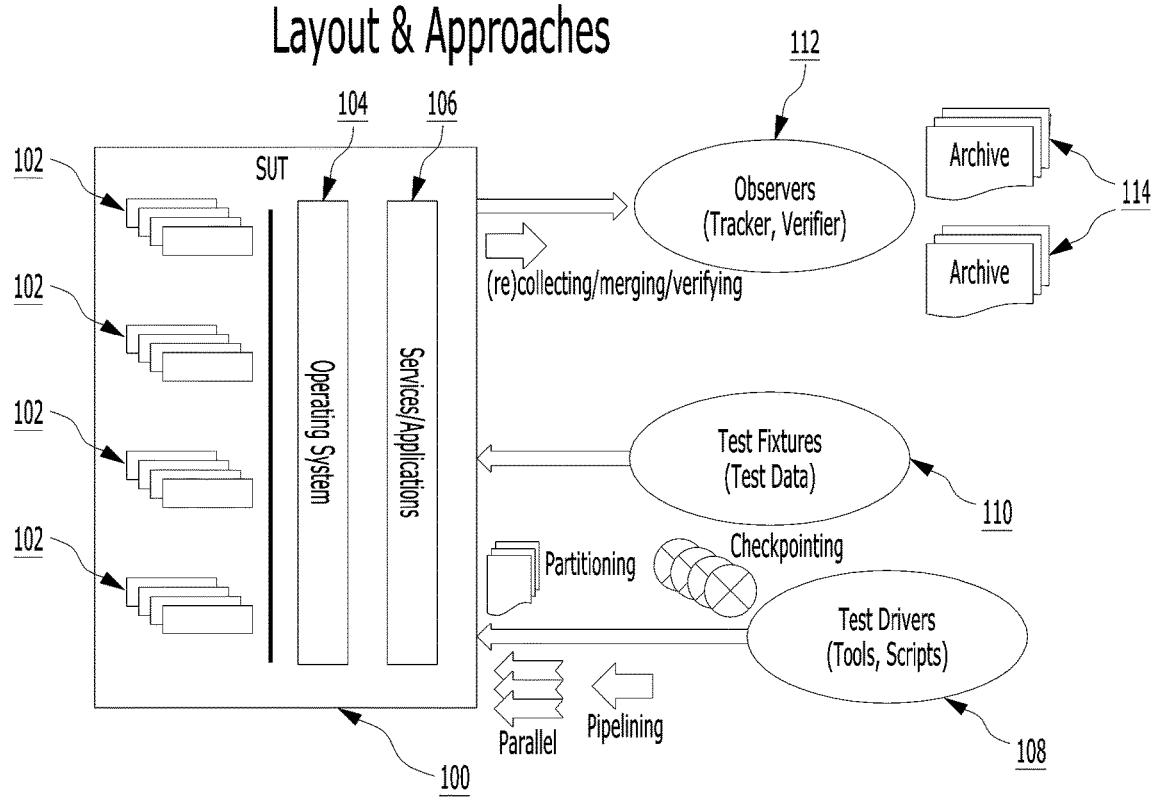
FIG. 1 is an architecture diagram illustrating a AFA testing of a system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An All Flash Array (AFA) is a storage subsystem built around solid-state drives (SSDs) or flash memory rather than traditional hard disk drives (HDDs). The most obvious benefit of using flash in the array is in delivering very high input/output (I/O) capability. Typically, AFA devices are capable of delivering from 100,000 up to one million input/output operations per second (IOPS) in a single footprint, with latency figures of one millisecond or less. The AFA devices typically can be deployed to meet stringent performance demands and service important applications. Flash arrays can use new technology with fewer mature practices to aid evaluation, and the flash may behave in unfamiliar ways. In addition to unpredictability, solid-state media may have a finite lifetime, so the flash array can be designed for wear levelling across all devices and for multi-layer redundancy in case of failure.

Any flash storage is an inherently random access medium, and each SSD can deliver more than a hundred times the IOPS of enterprise class hard disk drives. Enterprise SSDs can deliver consistent low latency regardless of I/O type, access pattern, or block range. The delivery consistency can enable new and improved data services of the storage systems. However, the SSD reads are faster than writes. The flash also can wear out, and endurance thereof can be compromised if same flash locations are repeatedly written. Array controllers for AFA devices may be redesigned for endurance improvement, and consequently for being tested to highlight strengths and weaknesses.

Traditional disk subsystems are optimized to avoid random access. The array controllers are developed rapidly to be compatible with growth of the IOPS. Complex algorithms can be adapted to trade central processing unit (CPU) cycles and memory capacity for fewer accesses to an underlying disk subsystem of their arrays. Testing of the traditional storage may focus on characterizing the array controllers and caching. The testing of the traditional storage are differentiators for the disk arrays, and all tend to be limited by the same set of commodity disk technologies when actually accessing the disk.

With the above context, a number of flash array testing concepts and considerations critical to understand testing the AFA devices can be introduced in embodiments of the present invention, for a faster and more accurate testing optimizing the throughput/IOPS.

The flash is an inherently random access medium. The biggest obstacles to getting more IOPS from a spinning disk are seek times and rotational delays. To do a random I/O, the disk needs to first position the read/write head on the correct cylinder (called a "seek"), and then wait while the disk rotates to the correct sector. The flash accesses only need to specify the desired address, and the correct location can be accessed directly. Therefore, access time and latency is consistently low, regardless of where the requested data resides in the SSD's logical address space, or whether the subsequent requests access sequentially or randomly placed addresses.

The SSDs and flashes are complex all by themselves, while the flash media is passive and may need additional intelligence to become a storage device. All these devices can require a CPU (controller ASIC or FPGA), cache memory, onboard I/O logic, internal data protection algorithms, and active power management. These components can work in concert to address the concepts covered below, for improvement of reliability and performance. Many functions at device level can also present at array level. Sometimes the array can augment and multiply the capabilities of the devices. Other times, the array can assume that the devices cannot be trusted and that may need to compensate for possible shortcomings thereof.

The flash writes may consume more work than the flash reads. Reading the contents of flash is a quick and simple operation. The address and required data length of the corresponding flash reads are requested, and the device CPU can read the contents of specified cells and return the contents to the requestor. The flash writes can require the flash cells to be programmed with new values, take longer to complete the operation, and typically only operate on larger sections of the media. If the flash writes operation partially overwrites a section, the contents of the overwritten section must first be read, merged in the device's memory with the new data, and then written to a new blank section. If no blank sections are standing by, then the device must first find and erase an unused section. This may result in that the SSDs typically perform only half to a third as many writes per second as reads.

The flash wears out eventually. The act of erasing and programming sections of flash is inherently destructive to the media. The state of cells that have not been written for a long time can eventually degrade. Thus, the SSDs sometimes can refresh their contents through additional writes. The SSDs can compensate for wearing in various ways, but eventually all the SSDs can wear out with use. The arrays can be designed to minimize writes to flash, and one of the most effective ways is to avoid writing duplicate data (inline deduplication), plus implement smart data protection minimizing parity-related writes.

However, not all flashes are the same. The flashes and SSDs can be built and priced based on performance and endurance thereof. Single-level Cell (SLC) flash stores a single bit per cell, and each cell can typically be written around 100,000 times before being burned out. Multi-Level Cell (MLC) flash, also known as consumer grade (cMLC) flash, stores two bits per cell, and each cell can typically be written around 3,000 times before being burned out. The MLC flash also tends to be slower than the SLC. Enterprise MLC (eMLC) flash can use clever techniques to improve speed and endurance. The eMLC can typically be written about 30,000 times before wearing out.

Reserving capacity is a ubiquitous practice and can improve performance of the flash. Writing flash is relatively slow, and having large areas of pre-erased cells can mitigate some of the delay. Many flash arrays can reserve some amount of array's capacity to improve write performance. Indeed, reserved space is also prevalent in enterprise SSDs, which may contain more internal flash than they present to the outside world. The problem comes when the user expects the performance quoted with a mostly empty array, but wants to use all the capacity they purchased. When testing array performance, the most accurate expectations come from testing with the array almost completely full. Users typically target an 80% utilization rate and sometimes go above that. Testing with the array 90% full can be strongly recommended.

Flash Translation Layer (FTL) can be implemented in the flash. The SSDs can implement the FTL to make the flash act like the disk. The device CPU can provide all the various clever and complex operations beneath the FTL. The device CPU operation may include maintaining pre-erased regions of the flash cells, abstracting the logical location of data from the physical cells which hold the data at any point in time, and minimizing writes to actual flash, etc. These operations can be done on the flash device level, but can be typically analogous operations at the array level as well.

Garbage Collection is the process of proactively maintaining free pre-erased space on the flash to optimize writes. The garbage collection (GC) happens in SSDs and may happen at the array controller levels, although some flash arrays try to prevent the SSDs from performing their own internal garbage collection and preferring instead to utilize controller-level garbage collection algorithms that the manufacturers feel are superior. Ideally, the garbage collection happens in the background during idle periods. Consolidated infrastructures may operate continuously and never see idle periods. In this case, the garbage collection may impact production performance. Testing during continuous load forcing garbage collection to be active can be critical for accurately setting predictable performance expectations.

Wear leveling is an important part of the flash operation. Because repeated writes to a flash cell can eventually burn it out, it is important to write to all the cells evenly. This can be accomplished by separating logical from physical addresses, only writing to cleanly erased areas of the flash, and post-processing to erase the physical locations of data logically deleted or overwritten. At the SSD level, this can happen under the FTL. At the array level, the controller can manage the logical/physical abstraction and post-processing to clean up stale physical locations.

Write amplification can impact the flash endurance. Because the flash cells are erased and written in large sections, more data may be written to the media than requested by the user. For example, if the user needs to write 4 KB but the write block is 256 KB, the flash device may need to write 256 KB due to physical constraints. At the array level, redundant array of independent disks (RAID) algorithms may amplify writes by adding and updating parity. The garbage collection also can amplify writes by consolidating and moving partial stripes of data in order to free up more space for future writes. The SSDs and arrays can work to mitigate this by decoupling logical and physical locations, and also by combining many smaller requests into the same larger write block on the SSDs.

Lifetime throttling can be guaranteed. Some of the AFAs and SSDs can guarantee the products last a certain number of years or Testing for Tuberculosis (TB) written. Since workloads are varied and unpredictable, vendors may assure their guarantee by slowing down writes to the SSDs. Typically, the products initially can perform at a full speed. After a percentage of the flash cells write, the endurance can be exhausted, writes begin to be artificially throttled (slowed down). It usually starts slowly, but the closer the cells get to complete exhaustion the more writes can be throttled. The end effect is that performance of the array or SSD can degrade significantly over the deployed lifetime of the product. If the array is guaranteed for a specific number of years, whether the performance can be expected to degrade over time due to throttling may be verified by the vendors.

FIG. 1 is an architecture diagram illustrating a AFA testing of a system in accordance with an embodiment of the present invention. The said AFA devices or systems can be referred as a SUT 100. The SUT 100 can comprise arrays 102, an operating system 104, and a services/application layer 106.

Besides the SUT 100, architecture of layout and approaches can comprise 4 components, test drivers 108, data test fixtures 110, observers 112, and archives 114.

The test drivers 108 can perform partitioning, pipelining, and parallelizing automated tests on the SUT 100. The data test fixtures 110 can provide test data sets to the SUT 100.

The observers 112 can monitor, collect, verify, track, and archive the results. The observers 112 can include sensors, trackers, archivers 114, and verifiers. The sensors can collect and merge data on measured metrics. The trackers can incrementally relate old data, old results with new data and results. The archivers 114 can archive historical data and results. The verifiers can compare and verify results against expected benchmark numbers.

The archives 114 can be placed for storing the historical data. The operating methods, ideas, or a combination thereof, can be considered to accelerate, automate, and harden the testing of AFA systems and storages. The operating methods can comprise using of parallelism whenever deterministic and consistent results can be expected, pipelining sequences of tests using multiple sub-systems/sub-storage of the SUT, partitioning multiple sub-systems/sub-storage of the SUT for different tests, using of controlled definition of test scenarios and assertions and verifications, long-term and archival system for the test results, compatibility and substitution, and check-pointing, wherein the check-pointing is a technique to add fault tolerance into testing AFA systems. The check-pointing basically consists of saving a snapshot of the testing's state, so that the testing can restart from that point in case of any failure. The check-pointing can be particularly important for long running tests executed in vulnerable system under test, such as the SUT.

Figure 2:
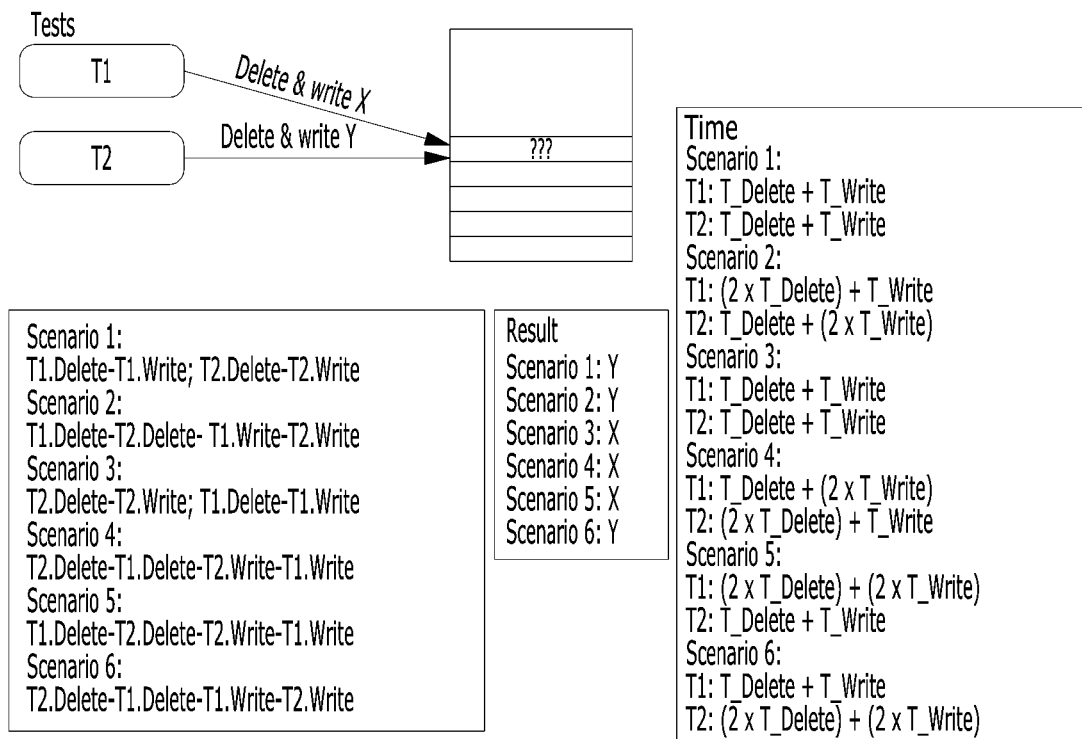
FIG. 2 is a diagram illustrating parallelism and race condition of a system in accordance with an embodiment of the present invention.

FIG. 2 is a diagram illustrating parallelism and race condition of a system in accordance with an embodiment of the present invention.

The key challenges for testing the AFAs can be as follows.

1. Performing intensive tests of storage sub-systems and of its smallest units inside the AFA to determine the maximum throughput/IOPS, wherein the maximum throughput/IOPS can form the baseline input for any AFA system or application level testing. This testing can be very critical as this is the first level of testing for any storage sub-system.

2. Determining the right combination/design for each storage sub-system which includes different types of disk drives, such as SATA, SAS, etc., can be a major challenge as there are more than 100 different combinations to choose from.

3. Analyzing and testing the AFA system to ensure data integrity and availability, wherein the data integrity and availability are the prime requirements of any data storage product to determine the reliability of storage devices.

4. Testing of the AFA based enterprise storage systems, which are peta-bytes in capacity, is another key challenge. Because it takes more than a week of time just to prepare the test bed for exchange testing on enterprise class storage with different SSDs, time to complete a clean cycle of testing can be too long to be practical. In addition to time constraint, testing AFA may require significant amount of resources, such as machines, CPU, bandwidth, network, etc.

5. Atomicity and isolation guarantees can be weak. In order to provide better performance and testing speed, executing the algorithm inside the SSD in parallel and running tests in parallel seems to be effective, however, this can create non-determinism which may skew the testing results. For example, assuming two writes W1 and W2 of tests T1 and T2, respectively, are sent to the same extent in an SSD, the testing result is specified as some mixture of the data from W1 and W2. This mixture might be limited by the atomicity provided by the SSD, which is implementation-dependent. Requests sent in parallel to the SSD may be executed in sequentially. For example, if the test T1=delete-write-data(X) is sent concurrently with the test T2=delete-write-data(Y) to the same storage location, there are six possible scenarios.

1) The SSD performs T1-Delete, T1-Write, T2-Delete and then T2-Write. At the end, Data Y is written at the same location.

2) The SSD performs T1-Delete, T2-Delete, T1-Write and then T2-Write. At the end, Data Y is written at the same location.

3) The SSD performs T2-Delete, T2-Write, T1-Delete and then T1-Write. At the end, Data X is written at the same location.

4) The SSD performs T2-Delete, T1-Delete, T2-Write and then T1-Write. At the end, Data X is written at the same location.

5) The SSD performs T1-Delete, T2-Delete, T2-Write and then T1-Write. At the end, Data X is written at the same location.

6) The SSD performs T2-Delete, T1-Delete, T1-Write and then T2-Write. At the end, Data Y is written at the same location.

The condition mentioned above is commonly referred as race condition. In general, the non-determinism and race condition that results from concurrently executing multiple requests or processing the requests on the SSD, the testing can pose a big challenge on the verification and validation. Not only the result of the operations inside the SSD may be un-deterministic but also the time of execution (latency) may yield different results. At the end, the result of testing may not be able to draw a strong conclusion how well the AFA system is performing.

Reproducibility and efficient testing are very crucial for the AFA. Due to long duration and unpredictable nature of the sub-storage medium, it may be impractical to have manual testing which variate each time the testing conducted. Small numbers of changes in testing variable can greatly alter the rest testing results, resulting in that a solid and valid conclusion may not possible to be made. Repeat testing can amplify the challenge of completing the clean run of test, because it takes so much time to complete it. Therefore, each testing procedure may be automated, and easily and consistently reproducible.

The embodiments of the present invention propose new intelligent systems, apparatus, and methods, which can automate testing for the AFA devices, underlying sub-storage systems, and components, until to the SSD (or any other flash devices) level. The automation may not only guarantee reproducibility and testing completion in a timely manner, but also allow hardened (consistent and valid) testing result to be produced, so that strong conclusion can be drawn without any doubt. The embodiments of the present invention also propose new approaches of AFA based system testing which are capable of handling and testing any scales of capacity of data storage.

Figure 3:
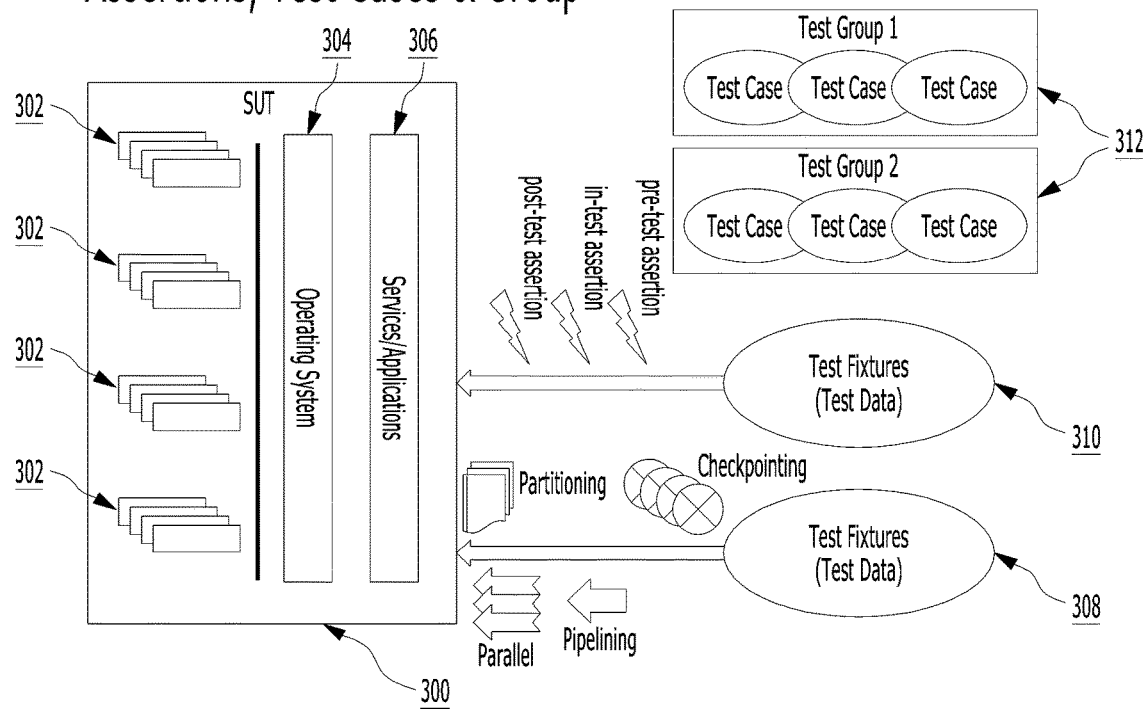
FIG. 3 is an architecture diagram illustrating a AFA testing of a system in accordance with an embodiment of the present invention.

FIG. 3 is an architecture diagram illustrating a AFA testing of a system in accordance with an embodiment of the present invention. The SUT 300 comprise arrays 302, operating system 304, and a service/application layer 306.

It is critical that tests should be independent, isolated reproducible, and repeatable. Debugging a test, that succeeds or fails as a result of other tests or other uncontrollable and unpredictable events, is painful and fruitless. A good testing framework can isolate the tests by running each of them on a different SUT or part of the SUT. When a test fails, the good testing framework can allow the test to be run and repeated in isolation for quick debugging. The good testing framework can also allow incremental or continual testing by freezing the state of the tests into a well-defined and known state.

The tests can be well organized, and reflect the structure of the tested system, such as the SUT. Each test can be grouped with relevant tests into test cases that can share data and subroutines. Common patterns of the test cases can be easy to recognize, and make tests easy to maintain. Such consistency can be especially helpful when switching projects and starting to work on a new SUT.

In addition to that, the tests can be portable and reusable. The tests can work on different operation systems (OSes), with different tools (scripts, programs etc.), with or without exceptions. Thus, the testing can easily work with a variety of configurations and can run in different platforms. When the tests fail, the tests can provide as much information about the problems as possible. However, the testing does not stop at the first test failure. Instead, the testing may only stop the current test in a whole defined state ("check-pointing"), and continue with the next test. Due to a large number of time required to complete a test, the tests on storage AFA devices can be fast. Therefore, the testing system can be able to reuse the shared resources across tests by "pipelining", "parallelization", and "partitioning", and pay the price for the set-up/tear-down only once, without making tests depend on each other.

The architecture shown in FIG. 3, can comprise test drivers 308, test fixtures 310, and test groups 312, such as a test group 1 or test group 2.

A test fixture data contained in the test fixtures 310 can be a set of data used to consistently test the SUT 300. The test fixture data can be accompanied by assertions, such as pre-test assertion, in-test assertion, or post-test assertion. The SUT 300 of the AFA storage system can include applications of the service/application layer 306, the operating system 304 or sub-systems, logical as well as physical volumes and the collection of the SSD(s), such as the arrays 302. The application can refer to high level service, such as Network File System (NFS), Internet Small Computer Systems Interface (iSCSI), Server Message Block (SMB), Hadoop Distributed File System (HDFS), applications, such as database, or distributed systems, such as Hadoop, Backup, Memcached, and etc.

Figure 4:
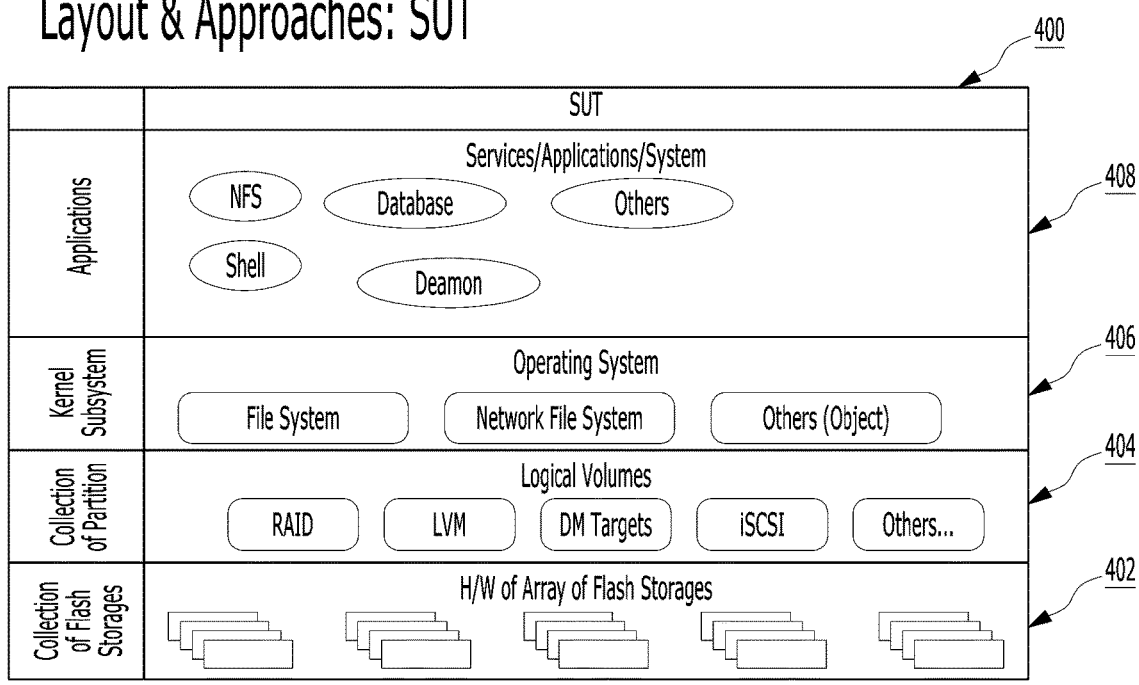
FIG. 4 is an architecture diagram illustrating a System Under Test (SUT) of a system in accordance with an embodiment of the present invention.

FIG. 4 is an architecture diagram illustrating a System Under Test (SUT) of a system in accordance with an embodiment of the present invention. The SUT 400 comprise collection of flash storages, such as arrays of flash storages 402, collection of partition, such as logical volumes 404, a kernel subsystem, such as an operating system 406, and applications, such as a service/application layer 408.

The logical volumes 404 can comprise RAID, Logical Volume Management (LVM), DA targets, iSCSI, or other applications. The operating system 406 can comprise file system, network file system, or others. The service/application layer 408 can comprise NFS, database, shell, daemon, or other objects.

Accordingly, the test drivers 308 and the test fixtures 310 of FIG. 3 can be divided into four categories, such as application drivers and application test fixtures, file (file system) drivers and file system test fixtures, volume drivers and volume test fixtures, and low level drivers and low level test fixtures.

The application drivers and application test fixtures can include all utilities, programs, scripts, and corresponding data sets, to drive the tests for application software. The application drivers and application test fixtures can also include testing high level services, such as access to remote file system, remote volume and drives, and also higher level file system oriented services, such as HDFS. Finally, the application drivers and application test fixtures can also cover the tests for high level distributed applications and services. The outcome of testing with application drivers can give the metric about the performance of the whole services or application, but not necessarily about the performance of each SSD thereof. The performance of whole services or application can be the aggregate performance of each SSD, the file system, the network, and the software application combined together.

The file (file system) drivers and file system test fixtures can include all utilities, programs, scripts and corresponding data sets to drive the tests for file system. The file drivers and file system test fixtures can also include testing file system services, such as creating, copying, modifying, and deleting files. The file drivers and file system test fixtures may not cover the tests for high level distributed file system or high level file system oriented services, such as HDFS, but may use transparent network file system to drive the tests of the performance of the file system across network boundary. The outcome of testing with file system drivers and corresponding test fixtures can give the metric about the performance of the file system services, but not necessarily and directly about the performance of each SSD. The performance of the file system services is the aggregate performance of each SSD, the file system and the operating system combined together. However, depending on SUT configuration, the performance of the file system services might relate and correspond to any malfunctions, performance changes on each SSD as well.

The volume drivers and volume test fixtures may include all utilities, programs, scripts and corresponding data sets to drive the tests for storage volume which can be virtual or physical. Volume refers to any storage entity which can be addressed by its logical address. Volume drivers and volume test fixtures may include testing all subsystems for low-level access to the storage medium, such as block drivers and the controller of the storage devices. The outcome of testing with volume drivers will give the metric about the performance of the low-level subsystem, software-system, and storage controllers. The result data can be related to the performance of each SSD, because the volume drivers can directly test each SSD as the SUT thereof. The test fixtures can be created in the file system, or in the operating system.

The low level drivers and low level test fixtures can include all utilities, programs, scripts and corresponding data sets to drive the tests directly for low level SSD system. The low level drivers and low level test fixtures can include testing low level storage oriented software system services, such as firmware and other storage controller's software systems. The outcome of testing with application drivers can give the metric directly about performance of each SSD, wherein the performance of each SSD is the sole performance of each SSD alone. The test fixtures can be created in the file system, in the operating system, or inside each SSD itself.

Figure 5A:
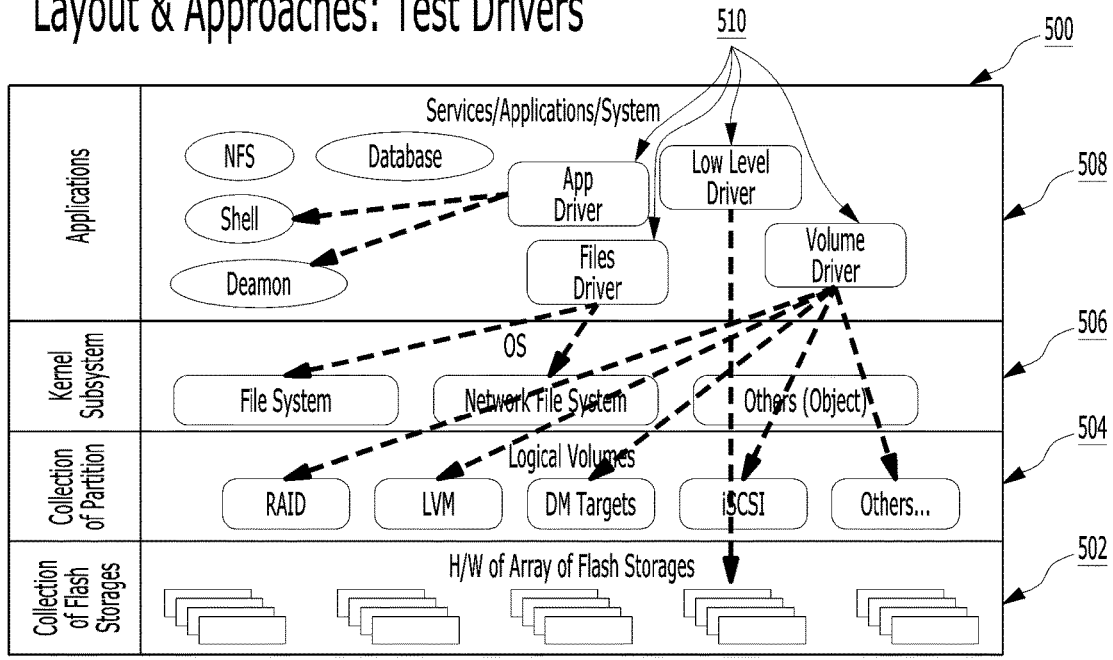
FIG. 5A is an architecture diagram illustrating a System Under Test (SUT) of a system in accordance with an embodiment of the present invention.

FIG. 5A is an architecture diagram illustrating a System Under Test (SUT) of a system in accordance with an embodiment of the present invention. The SUT 500 comprise collection of flash storages, such as arrays of flash storages 502, collection of partition, such as logical volumes 504, a kernel subsystem, such as an operating system 506, and application, such as a service/application layer 508. The service/application layer 508 can include test drivers 510.

The logical volumes 504 can comprise RAID, LVM, DA targets, iSCSI, or others. The operating system 506 can comprise file system, network file system, or others. The service/application layer 508 can comprise NFS, database, shell, daemon, or other objects. The test drivers 510 can comprise application drivers, file drivers, low level drivers, and volume drivers. The application drivers can be configured to drive tests of the service/application layer 508, such as the NFS, database, shell, daemon, or other applications. The file drivers can be configured to drive tests of the file system, network file system, or other objects. The volume drivers can be configured to drive tests of the RAID, LVM, DA targets, iSCSI, or others. The low level drivers can be configured to drive tests of the hardware of array of flash storages.

In the AFA devices testing, the test assertion is an expression encapsulating some testable metric specified about a target under test, such as the SUT. The expression is formally presented as the assertion, along with some form of identifier and threshold, to help ensure that tests of the target is properly and clearly related to the corresponding specified statements about the target, and more importantly meet the condition or metrics being specified. Usually the metric for each test assertion can be limited to one single aspect or metric specified. The assertion testing can be a type of testing that includes verifying, if the conditions or the result meet or exceed the number or variable defined for the product requirements.

The test assertion may include prerequisites which can be true for the test assertion to be valid. The test assertions can accompany the test fixtures. So, the testing can be started by writing pre-test assertions, which are statements that check whether a condition is true before running the tests, by writing in-test assertions which are statements that check whether specific metrics are met during the tests while giving the corresponding test fixtures (set of data) and monitoring its progress, and post-test assertions, which are statements that check whether the final and expected conditions and metrics are met. The assertion's result can be success/met, nonfatal failure, or fatal failure. If the fatal failure occurs, the current function can be aborted; otherwise the tests continue normally. Such scenario is referred here as a test case. The test case may contain one or many tests. The test cases can be grouped into a test case group that reflects the structure of the tested AFA device's metrics, such as IOPS, latency, throughput, etc. When multiple tests in a test groups need to share common resources and procedures, they can be put into a test fixture class.

Figure 5B:
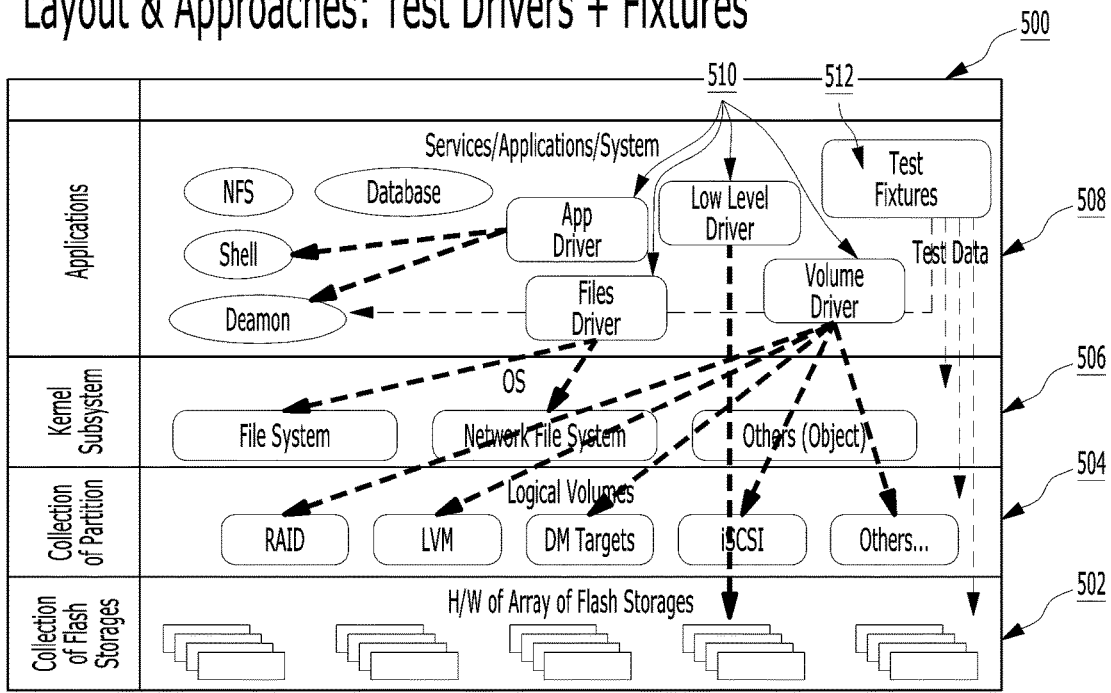
FIG. 5B is an architecture diagram illustrating a System Under Test (SUT) of a system in accordance with an embodiment of the present invention.

FIG. 5B is an architecture diagram illustrating a System Under Test (SUT) of a system in accordance with an embodiment of the present invention. The SUT 500 comprise collection of flash storages, such as arrays of flash storages 502, collection of partition, such as logical volumes 504, a kernel subsystem, such as an operating system 506, and application, such as a service/application layer 508. The service/application layer 508 can include test drivers 510 and test fixtures 512.

The logical volumes 504 can comprise RAID, LVM, DA targets, iSCSI, or others. The operating system 506 can comprise file system, network file system, or others. The service/application layer 508 can comprise NFS, database, shell, daemon, or other objects. The test drivers 510 can comprise application drivers, file drivers, low level drivers, and volume drivers. The application drivers can be configured to drive tests of the service/application layer 508, such as the NFS, database, shell, daemon, or other applications. The file drivers can be configured to drive tests of the file system, network file system, or other objects. The volume drivers can be configured to drive tests of the RAID, LVM, DA targets, iSCSI, or others. The low-level drivers can be configured to drive tests of the hardware of array of flash storages. The test fixtures 512 can generate test data sets corresponding to the test drivers 510, and send the test data sets to the service/application layer 508, arrays of flash storages 502, logical volumes 504, and the operating system 506, respectively.

Figure 6A:
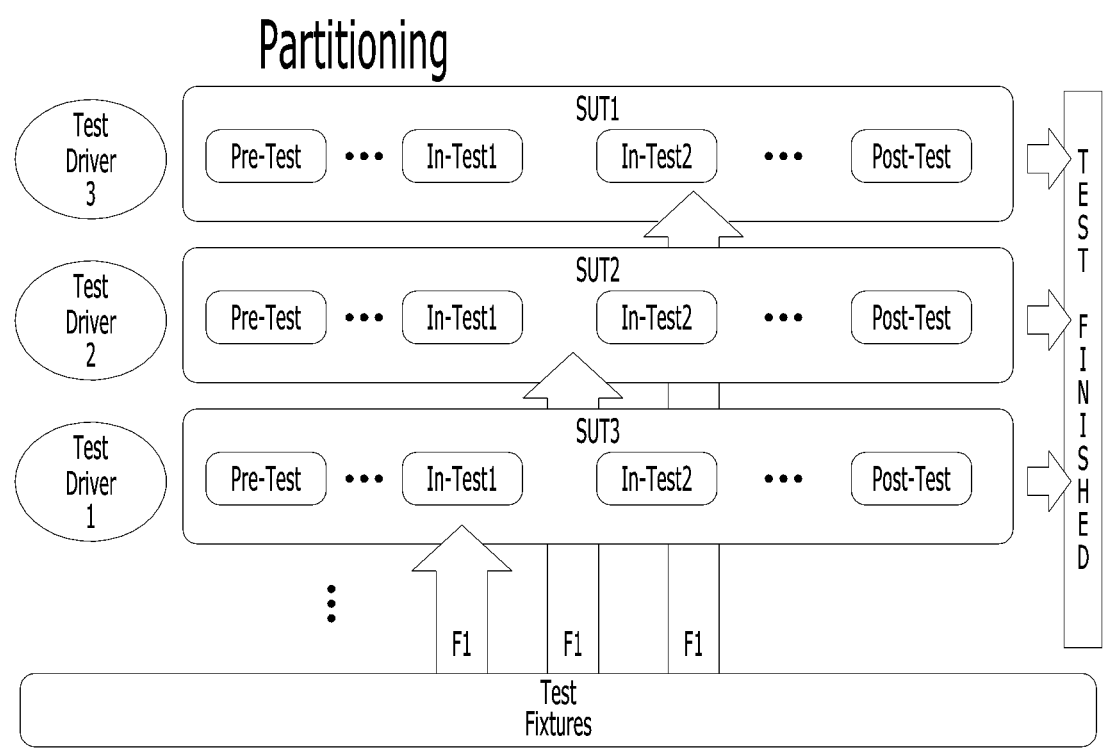
FIG. 6A is an architecture diagram illustrating testing partitioning of a system in accordance with an embodiment of the present invention.

FIG. 6A is an architecture diagram illustrating testing partitioning of a system in accordance with an embodiment of the present invention.

Some of the methods and techniques to share common resources and procedures in testing AFA devices can include partitioning, pipelining, parallelism, compatibility and substitution, or check-pointing.

Partitioning is a technique to efficiently execute different tests under the same assertions and using the same data sets. The goal is to accelerate testing, mutually exclude race conditions, and gather different types of results of testing at once. To execute automatically, the test fixture can be required to be well understood and completely deterministic. Defining or setting up a new test fixture can be time consuming, especially when dealing with complex system such as one in the AFA system. The partitioning can allow reusing well-defined set up of the test fixtures to be used repeatedly on part of the AFA system driven by different test drivers. The test drivers can determine metrics and the result data collected on the SUT. The tests can run faster by reusing the same test fixtures for several or many tests applied to the different segmented part of the SUT driven by various test drivers.

For example, as shown in FIG. 6A, the same test fixture F1 can provide the test data sets to SUT3, SUT2, and SUT1. The SUT1, SUT2, and SUT3 can be tested in parallel, and the test results can be generated in parallel to complete the tests. Each SUT can encapsulate at least one pre-test assertions, in-test assertions, and post-test assertions.

Figure 6B:
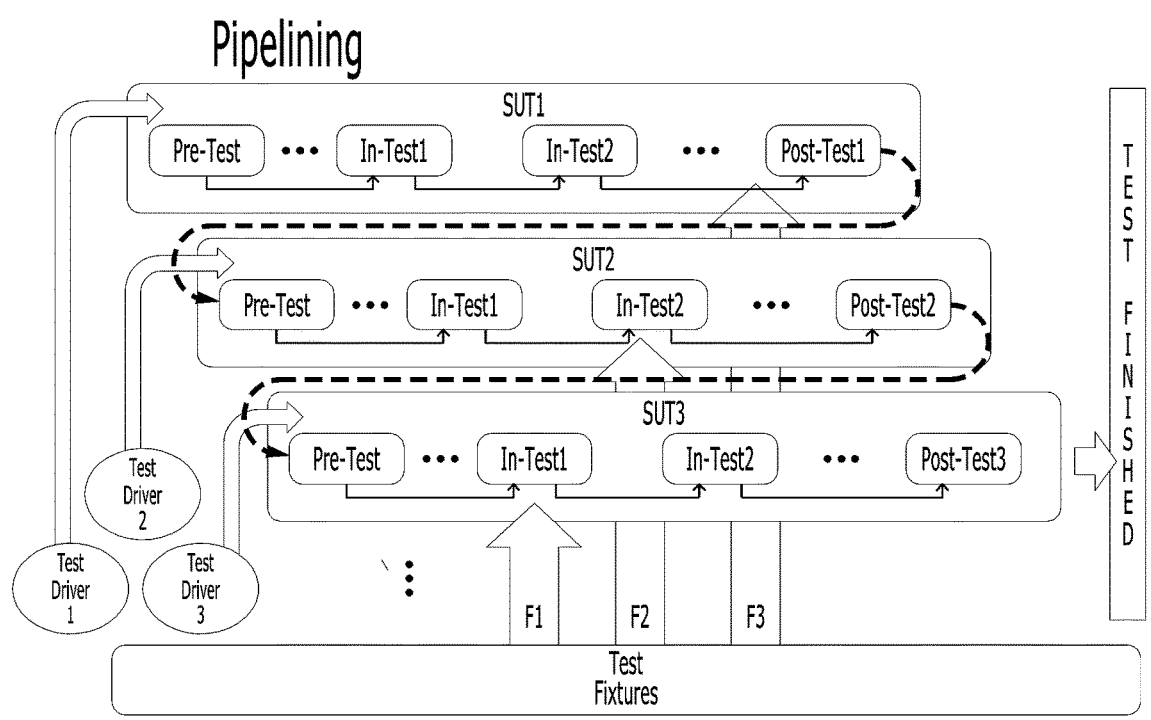
FIG. 6B is an architecture diagram illustrating testing pipelining of a system in accordance with an embodiment of the present invention.

FIG. 6B is an architecture diagram illustrating testing pipelining of a system in accordance with an embodiment of the present invention.

Pipelining is a technique to free the SUT from entering race condition while achieving or maintaining high performance testing. The AFA devices sometimes can require a specific procedure to reach a stable state, in which a test can be performed to yield reliable and meaningful result. Although it is not necessarily required, by having multiple equally functioning SUT, multiple tests driven by a single test driver can be run according to fixed sequences in a pipelining mode. The pipeline can be a set of test processing elements or procedures connected in series, where the output of one element or procedure can be the input of the next one. The elements or procedures of the pipeline can often be executed in parallel or in time-sliced fashion without having to wait for the completion of the whole sequences of test procedures, resulting in a tremendous amount of time saving. Because pipelining is executed sequentially, race condition error may never occur and yet the tests can be performed quickly and efficiently.

For example, as shown in FIG. 6B, the test fixture F1 can provide the test data sets to SUT3, F2 can provide the test data sets to SUT2, and F3 can provide the test data sets to SUT1. The test driver 1 can drive the SUT1, the test driver 2 can drive the SUT2, and the test driver 3 can drive the SUT3. The SUT1, SUT2, and SUT3 can be tested in series, the test results of the SUT1 can be input of the SUT2, and the test results of the SUT2 can be input of the SUT3. Each SUT can encapsulate at least one pre-test assertions, in-test assertions, and post-test assertions.

Figure 6C:
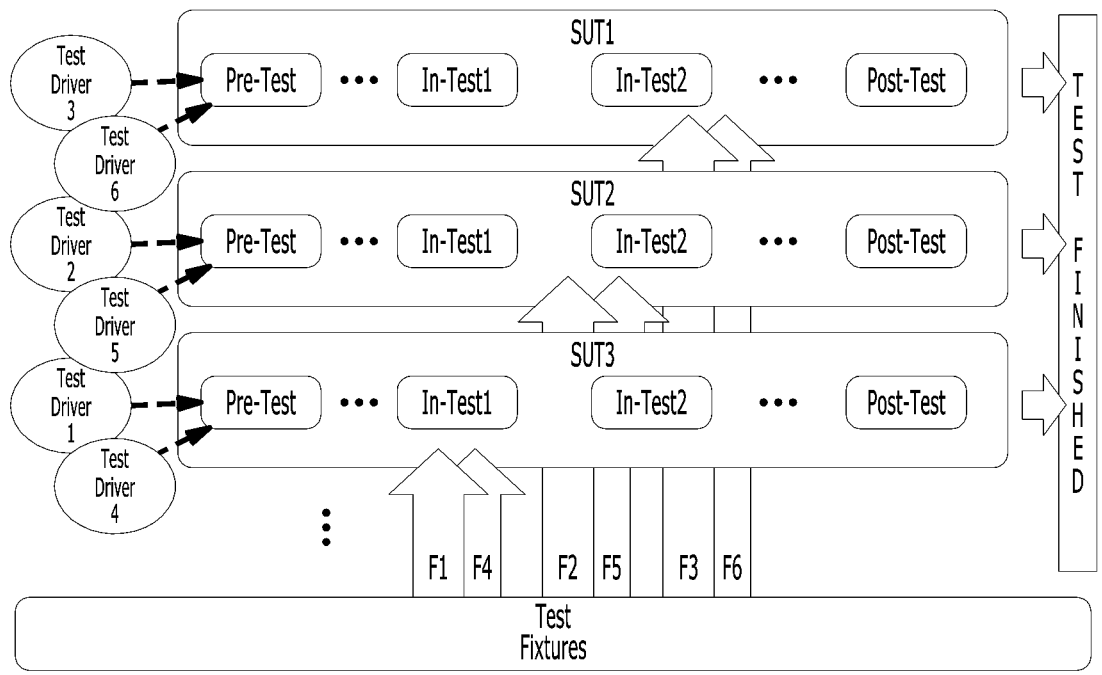
FIG. 6C is an architecture diagram illustrating testing parallelizing of a system in accordance with an embodiment of the present invention.

FIG. 6C is an architecture diagram illustrating testing parallelizing of a system in accordance with an embodiment of the present invention.

Parallelism is a technique to utilize idle time of the SUT to run other tests, for speeding up the testing. Since the interferences can cause race condition, among the tests, designing tests running in parallel using one single SUT may not easy. However, in case multiple SUT are available, running different tests in parallel can speed up the conclusion of the tests. By using different test fixtures or different test drivers, all tests can be run on one single SUT simultaneously. Due to the race condition, the types of the tests safely run in this fashion can be limited, in the condition that no shared resources may be used while being tested at same time. Such testing scenarios on the AFA systems can be achievable if the tests are conducted using different category of the test drivers, such as parallel run of combination of application test drivers, file system together with low level test drivers etc.

Compatibility and substitution is a technique to substitute or switch failing test of the SUT in different SUT environment. However, two SUT environments are assumed compatible with each other. For example, as shown in FIG. 6C, the test fixtures F1 and F4 can provide the test data sets to SUT3, F2 and F5 can provide the test data sets to SUT2, and F3 and F6 can provide the test data sets to SUT1. The test driver 3 and test driver 6 can drive the SUT1, the test driver 2 and test driver 5 can drive the SUT2, and the test driver 1 and test driver 4 can drive the SUT3. The SUT1, SUT2, and SUT3 can be tested in parallel, and the test results can be generated in parallel to complete the tests. Each SUT can encapsulate at least one pre-test assertions, in-test assertions, and post-test assertions.

Check-pointing refers to a method to mark a complete and clean state of a part of whole test scenario. Because a test can consume a significant amount of time to complete to get a meaningful result, the check-pointing technique can be very useful, so that a failing test does not need to restart from the beginning, but just from the last clean state before the test is failing.

It has been discovered that, the testing system disclosed in the embodiments of the present invention can provide a faster and more accurate testing system, such as SUT in AFA system. The system disclosed can deliver a very high I/O capability, meet stringent performance demands, and service important applications, by running multiple tests.

Figure 7:
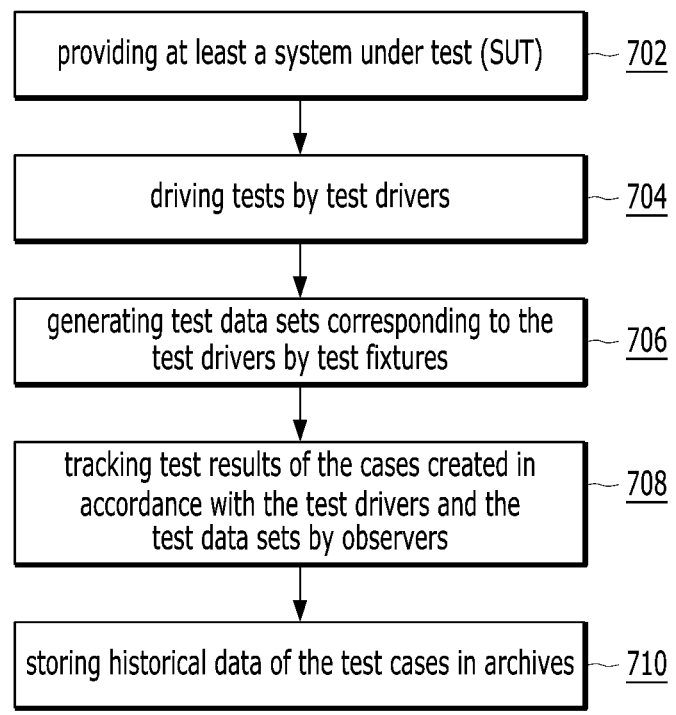
FIG. 7 is a flowchart illustrating an operating method of a system in a further embodiment of the present invention.

FIG. 7 is a flowchart illustrating an operating method of a system in a further embodiment of the present invention. The flowchart of operating method of a system comprising: providing at least a system under test (SUT) having collection of flash storages including hardware of array of flash storages, collection of partitions including logical volumes, a kernel subsystem including operating system, and an application layer including services, applications, systems, or a combination thereof in a block of 702; driving tests by test drivers, wherein the tests are configured for testing the SUT in a block of 704; generating test data sets corresponding to the test drivers by test fixtures in a block of 706; tracking test results of test cases created in accordance with the test drivers and the test data sets by observers, wherein the test results include metrics a block of 708; and storing historical data of the test cases in archives a block of 710.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A system comprising:
a system under test (SUT) having a hardware array of flash storages, partitions including logical volumes, a kernel subsystem including an operating system, and an application layer including services, applications, systems, or a combination thereof;
wherein the application layer receives test drivers and corresponding test fixtures from an external source, segments the SUT into subsystems, including a first segmented subsystem and a second segmented subsystem, and drives a different test using a different text fixture on each segmented subsystem, and
wherein a result of the test driven on the first segmented subsystem is applied as an input to the test driven on the second segmented subsystem.

2. The system recited in claim 1 wherein the logical volumes comprise RAID, LVM, DA targets, iSCSI, or a combination thereof.

3. The system recited in claim 1 wherein the operating system comprises file system, network file system, or a combination thereof.

4. The system recited in claim 1 wherein the application layer comprises NFS, database, shell, daemon, or a combination thereof.

5. An operating method of a system comprising:
providing a system under test (SUT) having a hardware array of flash storages, partitions including logical volumes, a kernel subsystem including an operating system, and an application layer including services, applications, systems, or a combination thereof;
segmenting the SUT into subsystems;
driving, by test drivers, tests to be performed on the SUT;
generating, by test fixtures, test data sets corresponding to the test drivers;
segmenting the SUT into subsystems, including a first segmented subsystem and a second segmented subsystem;
creating test cases in accordance with the test drivers and the test data sets, including creating a test case to drive a different test using a different text fixture on each segmented subsystem;
tracking, by observers, test results of the test cases, wherein the test results include metrics; and
storing historical data of the test cases in archives;
wherein a result of the test driven on the first segmented subsystem is applied as an input to the test driven on the second segmented subsystem.

6. The method recited in claim 5 wherein each test fixture generated corresponds to a respective one of the test drivers, the method further comprising categorizing the test fixtures and their respective test drivers into application drivers and respective application test fixtures, file drivers and respective file test fixtures, volume drivers and respective volume test fixtures, and lower level drivers and respective lower level test fixtures.

7. The method recited in claim 5 wherein the generating test data sets includes generating test data sets accompanied by assertions.

8. The method recited in claim 7 wherein the generating test data sets accompanied by assertions includes writing pre-test assertions, in-test assertions, and post-test assertions.

9. The method recited in claim 5 further comprising grouping the test cases into test groups, wherein the test cases in a same test group reflecting structure of the metrics, and one of the test cases contains at least one of the tests.

10. The method recited in claim 5 further comprising categorizing the tests into test fixture classes, wherein the tests in a same test fixture class share common resources and procedures, and one of the test fixture classes contains at least one of the tests.

11. The method recited in claim 10 wherein the sharing common resources and procedures includes partitioning, wherein the partitioning executes different tests under the same conditions with the same test data sets.

12. The method recited in claim 10 wherein the sharing common resources and procedures includes pipelining, wherein the pipelining connects a set of test processing elements or procedures in series.

13. The method recited in claim 10 wherein the sharing common resources and procedures includes parallelizing, wherein the parallelizing conducts the tests using different categories of the test drivers.

14. The method recited in claim 10 wherein the sharing common resources and procedures includes sharing failed tests of the SUT with a different compatible SUT.

15. The method recited in claim 10 wherein the sharing common resources and procedures includes check-pointing, wherein the check-pointing marks a complete and clean state of a portion of an entire test performed on the SUT.

16. A testing system comprising:
    a system under test (SUT) having a hardware array of flash storages, partitions including logical volumes, a kernel subsystem including an operating system, and an application layer including services, applications, systems, or a combination thereof;
    test drivers configured to drive tests to be performed on the SUT;
    test fixtures configured to generate test data sets corresponding to the tests driven by the test drivers;
    observers configured to track test results of test cases created in accordance with the test drivers and the test data sets, wherein the test results include metrics; and
    archives configured to store historical data of the test cases;
    wherein the SUT is segmented into subsystems, including a first segmented subsystem and a second segmented subsystem, and a different test using a different test fixture is applied to each segmented subsystem, and
    wherein a result of the test driven on the first segmented subsystem is applied as an input to the test driven on the second segmented subsystem.

17. The testing system recited in claim 16 wherein each test fixture corresponds to a respective one of the test drivers, and wherein the test fixtures and their respective test drivers are categorized into application drivers and respective application test fixtures, file drivers and respective file test fixtures, volume drivers and respective volume test fixtures, and lower level drivers and respective lower level test fixtures.

18. The testing system recited in claim 16 wherein the test data sets are accompanied by assertions.

19. The testing system recited in claim 16 wherein the test cases are grouped into test groups, wherein the test cases in a same test group reflecting structure of the metrics, and one of the test cases contains at least one of the tests.

20. The testing system recited in claim 16 wherein the tests are categorized into test fixture classes, wherein the tests in a same test fixture class share common resources and procedures, and one of the test fixture classes contains at least one of the tests.

* * * * *